United States Patent
Kumagai

(10) Patent No.: US 9,093,493 B2
(45) Date of Patent: Jul. 28, 2015

(54) WIDE BANDGAP INSULATED GATE SEMICONDUCTOR DEVICE

(71) Applicant: Fuji Electric Co., Ltd., Kanagawa (JP)

(72) Inventor: Naoki Kumagai, Nagano (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 0 days.

(21) Appl. No.: 14/463,262

(22) Filed: Aug. 19, 2014

(65) Prior Publication Data

US 2015/0053999 A1    Feb. 26, 2015

(30) Foreign Application Priority Data

Aug. 23, 2013    (JP) .................................. 2013-172979

(51) Int. Cl.
| | |
|---|---|
| H01L 29/15 | (2006.01) |
| H01L 29/66 | (2006.01) |
| H01L 21/28 | (2006.01) |
| H01L 29/739 | (2006.01) |
| H01L 29/16 | (2006.01) |
| H01L 29/20 | (2006.01) |

(52) U.S. Cl.
CPC ........ *H01L 29/7395* (2013.01); *H01L 29/1602* (2013.01); *H01L 29/1608* (2013.01); *H01L 29/2003* (2013.01)

(58) Field of Classification Search
CPC ............ H01L 29/0878; H01L 29/7813; H01L 29/41766
USPC ............ 257/77, E21.383, E29.198, 327, 328, 257/330, 341; 438/234, 96, 167, 571
See application file for complete search history.

(56) References Cited

U.S. PATENT DOCUMENTS

| | | | |
|---|---|---|---|
| 2,025,237 | A | * 12/1935 | Harper .......................... 451/552 |
| 6,180,958 | B1 | 1/2001 | Cooper, Jr. |
| 6,570,185 | B1 | 5/2003 | Tan |

(Continued)

FOREIGN PATENT DOCUMENTS

| | | |
|---|---|---|
| JP | 3259485 B2 | 2/2002 |
| JP | 4564362 B2 | 10/2010 |

(Continued)

*Primary Examiner* — Long K Tran
*Assistant Examiner* — Dzung Tran
(74) *Attorney, Agent, or Firm* — Chen Yoshimura LLP

(57) ABSTRACT

A wide bandgap insulated gate semiconductor device includes a semiconductor substrate made of semiconductor having a bandgap wider than silicon; $n^-$ drift layer over the semiconductor substrate; p-channel regions selectively disposed over the drift layer; $n^+$ semiconductor regions selectively disposed in respective surfaces in the channel regions; a plurality of $p^+$ base regions in contact with bottoms of the respective channel regions; a protruding drift layer portion that is n-type region interposed between the p-channel regions and the $p^+$ base regions thereunder; a gate electrode formed, through a gate insulating film, on the protruding drift layer portion and on respective surfaces of the p-channel regions; a source electrode in contact with the $n^+$ semiconductor regions in the channel regions; and a $p^+$ floating region inside the protruding drift layer portion, having side faces respectively facing side faces of the second conductivity type base regions, wherein respective gaps between the $p^+$ base regions and the $p^+$ floating region defined by the respective side faces have a wide portion and a narrow portion.

5 Claims, 9 Drawing Sheets

(56) References Cited

U.S. PATENT DOCUMENTS

| | | |
|---|---|---|
| 2005/0161732 A1 | 7/2005 | Mizukami et al. |
| 2008/0014702 A1* | 1/2008 | Kumar et al. ............... 438/269 |
| 2009/0114923 A1* | 5/2009 | Iwamuro ...................... 257/77 |
| 2010/0013010 A1* | 1/2010 | Akiyama et al. ............. 257/334 |
| 2011/0057202 A1 | 3/2011 | Kono et al. |
| 2011/0254010 A1* | 10/2011 | Zhang .......................... 257/66 |

FOREIGN PATENT DOCUMENTS

| | | |
|---|---|---|
| JP | 2011-60930 A | 3/2011 |
| JP | 5054255 B2 | 10/2012 |
| WO | 98/35390 A1 | 8/1998 |

* cited by examiner

WIDE BANDGAP INSULATED GATE SEMICONDUCTOR DEVICE

BACKGROUND OF THE INVENTION

1. Field of the Invention

The present invention relates to a wide bandgap insulated gate semiconductor device for use with inverters, switching power sources, and the like.

2. Description of Related Art

Due to excellent characteristics such as a high electric breakdown field and high heat transmittance, there is an expectation that wide bandgap semiconductors such as silicon carbide (hereinafter, SiC), gallium nitride (GaN), and diamond will be used for power devices that require a particularly high breakdown voltage and that need to be low loss.

FIG. 8 is a cross-sectional view of a single cell of a conventional planar gate SiC vertical power MOSFET. In FIG. 8, a low impurity concentration n-type drift layer is deposited by SiC epitaxial growth on an n-type SiC semiconductor substrate ($n^+$ substrate 1) with a high impurity concentration. A plurality of p-channel regions 3 are formed on portions of the surface of this low impurity concentration n-type drift layer ($n^-$ drift layer 2). A high impurity concentration p-base region ($p^+$ base region 4) for suppressing the spread of the depletion layer is positioned below the p-channel regions 3 in order for the p-channel regions 3 to prevent punch-through during reverse-bias. An n-type region (JFET region 2a) interposed between the respective plurality of p-channel regions 3 and the $p^+$ base region 4 thereunder is connected to the $n^-$ drift layer 2.

The $n^+$ source regions 5 and $p^+$ contact regions 6 for low-resistance connection of the respective p-channel regions 3 ($p^+$ base region 4) to a source electrode 9 are formed on respective portions of surface layers of the respective p-channel regions 3. Through an oxidized film 7, a poly-Si gate electrode 8 covers the $n^+$ source region 5 from the end surface thereof along the top of the respective p-channel regions 3 and the JFET region 2a. It is common to make the impurity concentration of the poly-Si gate electrode 8 greater than that of the $n^-$ drift layer 2 in order to reduce JFET resistance that occurs in the JFET region 2a interposed between the respective p-channel regions 3 and the $p^+$ base region 4. This JFET resistance occurs due to the depletion layer that spreads during on-bias, which makes the pathway narrower. The source electrode 9 is in low-resistance contact with the surface of the $n^+$ source region 5 and the $p^+$ contact region 6, and a drain electrode 10 is in low-resistance contact with the rear surface on the opposite side of the $n^+$ substrate 1.

The basic operation of the SiC-MOSFET will be described below. If a gate voltage of at least a certain threshold is applied to the poly-Si gate electrode 8, then an inversion layer is formed on the respective p-channel region 3 surface layers directly below the poly-Si gate electrode 8. In this state, if a positive voltage is applied to the drain electrode 10, then an electron path will be formed through the source electrode 9, the $n^+$ source region 5, the surface inversion layer of p-channel regions 3, the JFET region 2a, the $n^-$ drift layer 2, the $n^+$ substrate 1, and the drain electrode 10, in this order. In other words, current will flow from the drain electrode 10 towards the source electrode 9.

Meanwhile, if a voltage of less than or equal to a certain threshold is applied to the poly-Si gate electrode 8, then the inversion layer on the surface of the respective p-channel regions 3 will disappear and current will not flow. This basic operation is the same as that of an ordinary MOSFET using a silicon (Si) semiconductor. Due to wide bandgap semiconductors generally having a higher electric breakdown field than a Si semiconductor (approximately 10× higher than 4H-SiC, 11× higher than GaN, and 19× higher than diamond), the impurity concentration in the $n^-$ drift layer 2 can be increased and made thin; this makes it possible to realize a device with a higher breakdown voltage and a lower on-resistance than a Si-MOSFET.

Patent Document 1 discloses a MOSFET structure similar to that shown in FIG. 9, which is the cross-sectional view of a single cell of a SiC-MOSFET. Respective trenches have a sufficient depth to reach an $n^-$ drift layer 2 from a substrate surface, and both sides of a first trench 20 of a trench gate structure are sandwiched by a source electrode structure constituted of a source electrode 9 that is embedded in a second trench 21. In this trench source electrode structure, the depletion layer spreading from a $p^+$ base region 4 on the bottom of the second trench 21 in the ON state can pinch off charging current flowing to a parasitic transistor ($n^-$ drift layer 2 to p-channel region 3 to $n^+$ source region 5). As a result, it is possible to have a device that can withstand an abrupt rise in applied voltage. The reference character 1 represents an $n^+$ substrate, 7 represents a gate insulating film, 8 represents a gate electrode, 10 represents a drain electrode, and 13 represents an interlayer insulating film.

Furthermore, an electrostatic induction-type transistor with a high breakdown voltage (power SIT) and a junction-type field effect transistor with a high breakdown voltage (power JFET) in which the current flowing between the two primary terminals (source and drain) is controlled by the depletion layer that is formed by voltage applied to the gate electrode have been known. These power transistors maintain breakdown voltages by the semiconductor layer located between the gate region formed in the semiconductor layer and the drain region formed on one surface of the semiconductor layer being depleted. (See Patent Document 2.)

Patent Document 3 describes that a region that has a different conductivity from the $n^-$ drift layer is formed on the bottom of a trench gate that reaches the $n^-$ drift layer, and as a result, the electric field applied to the gate insulating film can be reduced to improve blocking voltage.

Patent Document 4 describes that a floating $p^-$ region is provided on a surface layer of an $n^-$ drift layer (JFET region) interposed in the $n^-$ drift layer along the main surface of a p-base region in a substrate surface facing a MOS gate structure of a planar gate SiC-MOSFET, and as a result, the electric field applied to the gate insulating film in contact with the surface of the JFET region can be suppressed even if the gap with the JFET region is widened.

RELATED ART DOCUMENTS

Patent Documents

Patent Document 1: Japanese Patent No. 3259485 (FIG. 7)
Patent Document 2: Japanese Patent No. 4564362 (paragraphs [0002] and [0006])
Patent Document 3: Japanese Patent No. 5054255 (abstract, FIG. 2)
Patent Document 4: Japanese Patent Application Laid-Open Publication No. 2011-60930 (FIG. 1, paragraphs [0007] to [0008])

SUMMARY OF THE INVENTION

As described above, one of the advantages of wide bandgap semiconductor is that the electric breakdown field is higher than a silicon (Si) semiconductor, thus making it possible to increase the impurity concentration (lower the resistance) of the drift layer even if the breakdown voltage is the same. Furthermore, the spread of the depletion layer being lessened makes it possible for the wide bandgap semiconductor to reduce the required thickness of the drift layer and to further lower resistance.

However, when forming a MOSFET using a wide bandgap semiconductor, the impurity concentration of the drift layer is increased and the thickness thereof is decreased, thereby increasing the electric field of the wide bandgap semiconductor directly below the gate insulating film more than in a Si semiconductor device, and thus causing an increase in the electric field across the gate insulating film; this makes the gate insulating film more susceptible to being damaged.

In particular, in a trench gate MOSFET, there is no pinch-off caused by the JFET effect as in a planar gate structure, and thus the gate insulating film on the trench bottom is more susceptible to having an excessive electric field applied thereto. To help alleviate this problem, a double trench MOSFET having a trench source structure as shown in FIG. 9 described above is known, in which the trench source structure has a second trench where the source electrode 9 has a similar depth to a trench gate structure, in addition to the first trench 20 for the trench gate structure. In this double trench MOSFET, the n$^-$ drift layer 2 portion adjacent to the channel portion can be pinched off by the depletion layer spreading from the p$^+$ base region 4 in contact with the bottom of the second trench in the OFF state (during reverse-bias of the primary junction), thus making it possible to reduce the electrical field applied to the gate insulating film.

However, when the parasitic transistor is pinched off, the on-resistance will increase due to the JFET effect, and thus a trade-off can be seen between reducing the electric field applied to the gate insluting film and lowering the on-resistance.

This trade-off is similar for a planar gate structure. In FIG. 8, increasing the width or the impurity concentration of the JFET region 2a can suppress the increase in on-resistance due to the JFET effect to a certain degree, but damage caused by an increase in the electric field applied to the gate insulating film 7 or a reduction in the breakdown voltage due to the increased electric field in the vicinity of the JFET region 2a is fundamentally unavoidable.

The present invention was made in consideration of the above-mentioned problems. The present invention aims at providing a wide bandgap insulated gate semiconductor device that is capable of improving the trade-off between reducing the electrical field applied the gate insulating film and lowering on-resistance.

Additional or separate features and advantages of the invention will be set forth in the descriptions that follow and in part will be apparent from the description, or may be learned by practice of the invention. The objectives and other advantages of the invention will be realized and attained by the structure particularly pointed out in the written description and claims thereof as well as the appended drawings.

To achieve these and other advantages and in accordance with the purpose of the present invention, as embodied and broadly described, in one aspect, the present invention provides a wide bandgap insulated gate semiconductor device that includes: a semiconductor substrate made of semiconductor having a bandgap wider than silicon; a first conductivity type drift layer over the semiconductor substrate, the drift layer having a low impurity concentration; a plurality of second conductivity type channel regions selectively disposed over the drift layer; first conductivity type semiconductor regions selectively disposed in respective surfaces in the channel regions, the first conductivity semiconductor regions having a high impurity concentration; a plurality of second conductivity type base regions in contact with bottoms of the respective channel regions, the base regions having a high impurity concentration; a protruding drift layer portion that is a first conductivity type region interposed between the plurality of channel regions and the plurality of second conductivity type base regions thereunder; a gate electrode formed, through a gate insulating film, on the protruding drift layer portion and on respective surfaces of the channel regions; a first common electrode in contact with the first conductivity type semiconductor regions in the channel regions; and a second conductivity type floating region inside the protruding drift layer portion, having side faces respectively facing side faces of the second conductivity type base regions, the second conductivity type floating region having a high impurity concentration, wherein respective gaps between the second conductivity type base regions and the second conductivity type floating region defined by the respective side faces have a wide portion and a narrow portion.

In this case, to create the wide portion and the narrow portion in the gap, a protruding part may be provided in at least one of the side face of each of the second conductivity type floating regions and the side face of the corresponding second conductivity type base region.

In another aspect, the present invention provides a wide bandgap insulated gate semiconductor device that includes: a semiconductor substrate; a first conductivity type drift layer over the semiconductor substrate, the first conductivity type drift layer having a low impurity concentration; a trench-gate structure constituted of a gate electrode formed in a first trench through a gate insulating film, the first trench reaching the first conductivity type drift layer from an upper surface; a trench-first electrode structure constituted of a first electrode embedded in each of second trenches that are disposed along both sides of the trench-gate structure, or constituted of a second conductivity type region embedded in each of the second trenches, the second conductivity type region being in contact with a first electrode, the second trenches reaching the first conductivity type drift layer from the upper surface, the second conductivity type region having a high impurity concentration; a second conductivity type floating region below or at a bottom of the first trench, the second conductivity type floating region having a high impurity concentration; and a second conductivity type base region disposed below or at a bottom of each of the second trenches, wherein each gap between the second conductivity type base region and the second conductivity type floating region has a wide portion and a narrow portion.

Here, each second conductivity type base region may contact the bottom of the corresponding second trench, and each second conductivity type floating region may contact the bottom of the corresponding first trench.

Alternatively, each second conductivity type base region may be separated from the bottom of the corresponding second trench by a portion of a second conductivity type channel region, and each second conductivity type floating region may be separated from the bottom of the corresponding first trench by the first conductivity type drift layer therebetween.

The insulated gate semiconductor device of the present invention may be a metal-oxide-semiconductor field-effect transistor or an insulated gate bipolar transistor. A silicon carbide semiconductor, gallium nitride semiconductor, or diamond may be used as the material for the semiconductor substrate.

According to at least some of the aspects of the present invention, it is possible to provide a wide bandgap insulated gate semiconductor device that can improve the trade-off between reducing the electrical field applied to the gate insulating film and reducing on-resistance.

It is to be understood that both the foregoing general description and the following detailed description are exemplary and explanatory, and are intended to provide further explanation of the invention as claimed.

DETAILED DESCRIPTION OF THE PRFERRED EMBODIMENTS

Figure 1A:
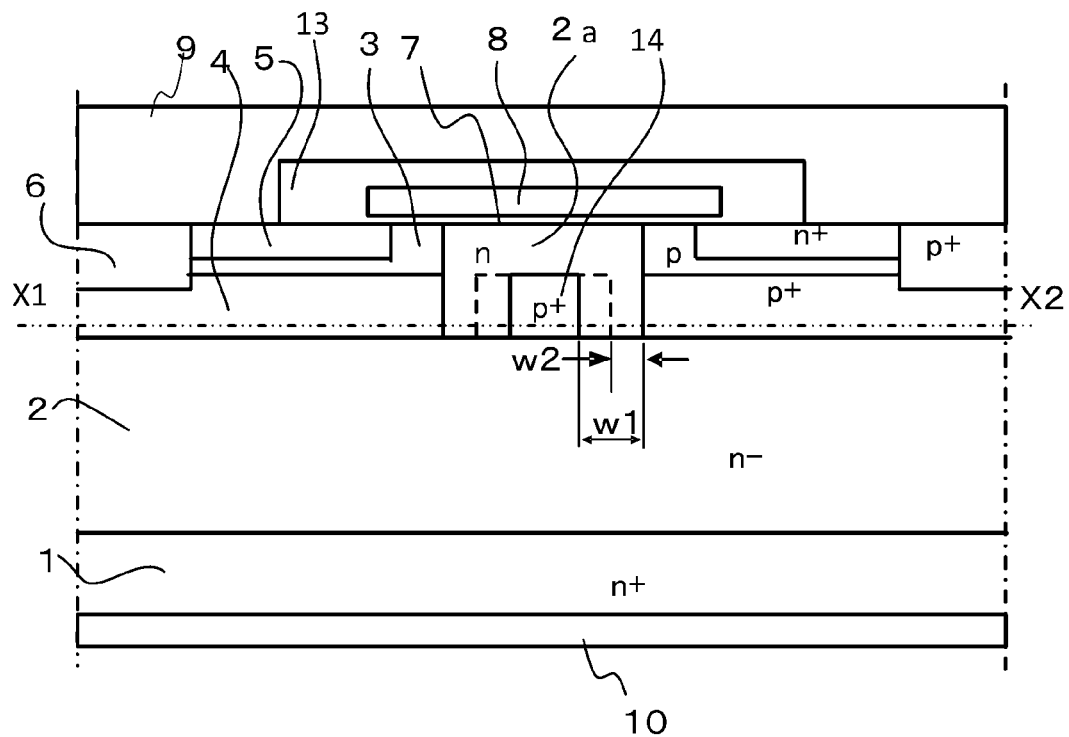
FIG. 1A is a cross-sectional view of main parts of a planar gate SiC-MOSFET.

SiC-MOSFETs according to respective embodiments of the wide bandgap insulated gate semiconductor devices of the present invention will be explained below with reference to the drawings. In the present specification and attached drawings, electrons or holes in layers or areas marked with an "n" or "p" signify majority carriers. A "+" or "−" attached to an "n" or "p" signifies that the impurity concentration is relatively high or relatively low. In the explanation of the embodiments below and the attached drawings, the same reference characters are attached to similar configurations and repetitive descriptions will be omitted. The respective attached drawings used to explain the embodiments have been made to be easy to view and understand, and thus are not drawn to scale. The present invention is not limited to the embodiments described below.

Embodiment 1

Figure 1B:
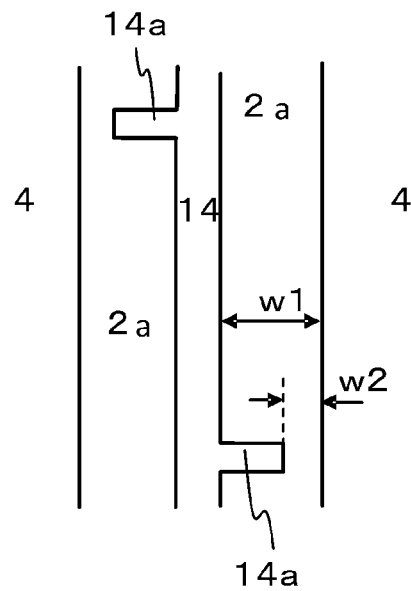
FIG. 1B is a horizontal cross-sectional view of the main parts in FIG. 1A along the striped line X1-X2 according to Embodiment 1 of the present invention.
Figure 8:
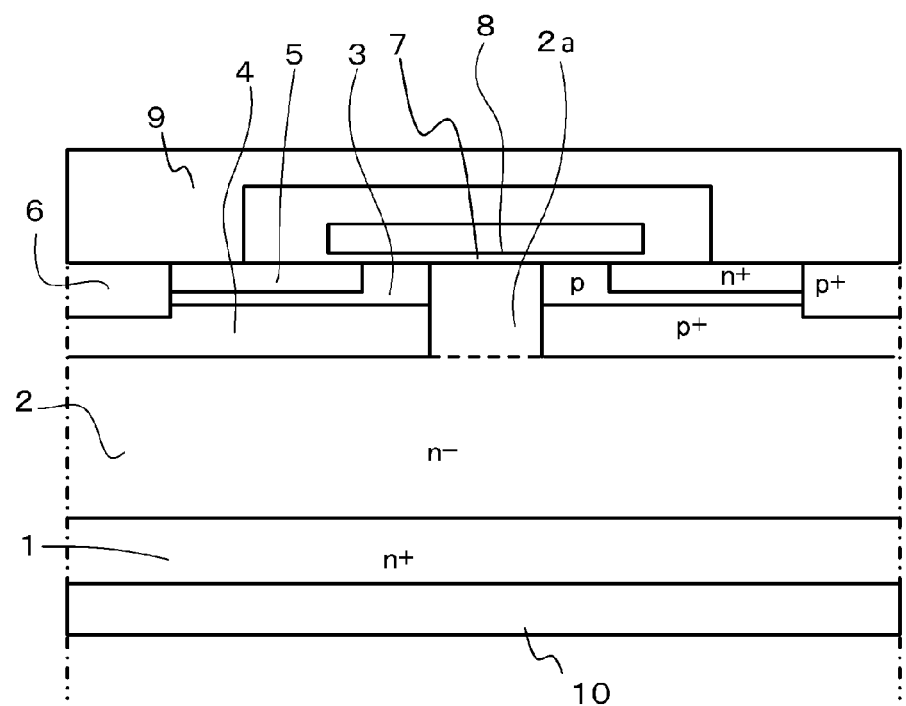
FIG. 8 is a cross-sectional view of main parts of a conventional planar gate SiC-MOSFET.
Figure 9:
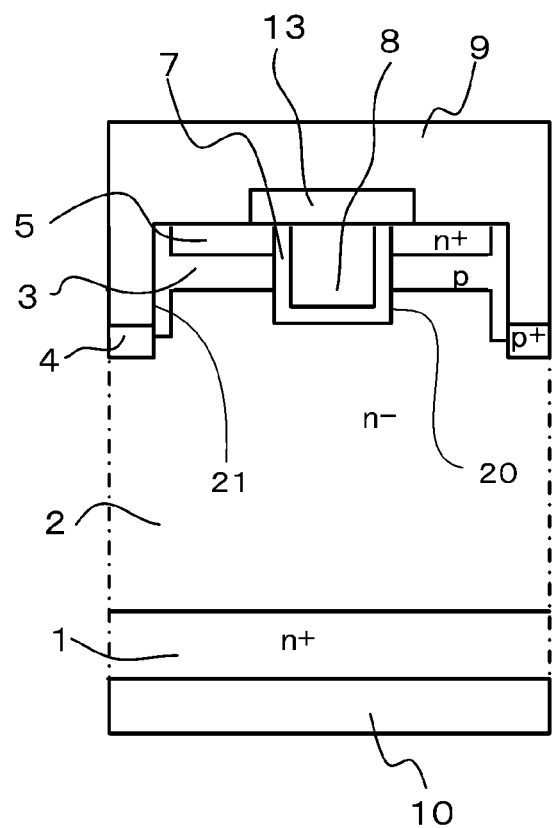
FIG. 9 is a cross-sectional view of main parts of a conventional trench gate SiC-MOSFET.

FIG. 1A is a vertical cross-sectional view (hereinafter, cross-sectional view) of a semiconductor substrate of a single cell of a SiC-MOSFET according to Embodiment 1 of the present invention, and FIG. 1B is a horizontal cross-sectional view of FIG. 1A along the line X1-X2. FIG. 1B shows the a JFET region $2a$ appearing on the surface of the horizontal cross-sectional view in FIG. 1A as a stripe shape in a plan view. FIG. 1A differs from the cross-sectional view of the conventional cell shown in FIG. 8 in that a floating p$^+$ region 14 is simultaneously formed along with a p$^+$ base region 4 on a portion inside the JFET region $2a$. As shown in FIG. 1B, in this embodiment, protruding parts 14$a$ are provided on portions of respective side faces of the floating p$^+$ region 14 that face the respective side faces of the p$^+$ base region 4 in a plan view. In this disclosure, the JFET region $2a$ may also be referred to as a protruding drift layer portion since it is connected to the drift layer 2 and protrudes upwardly from the drift layer 2.

Figure 2A:
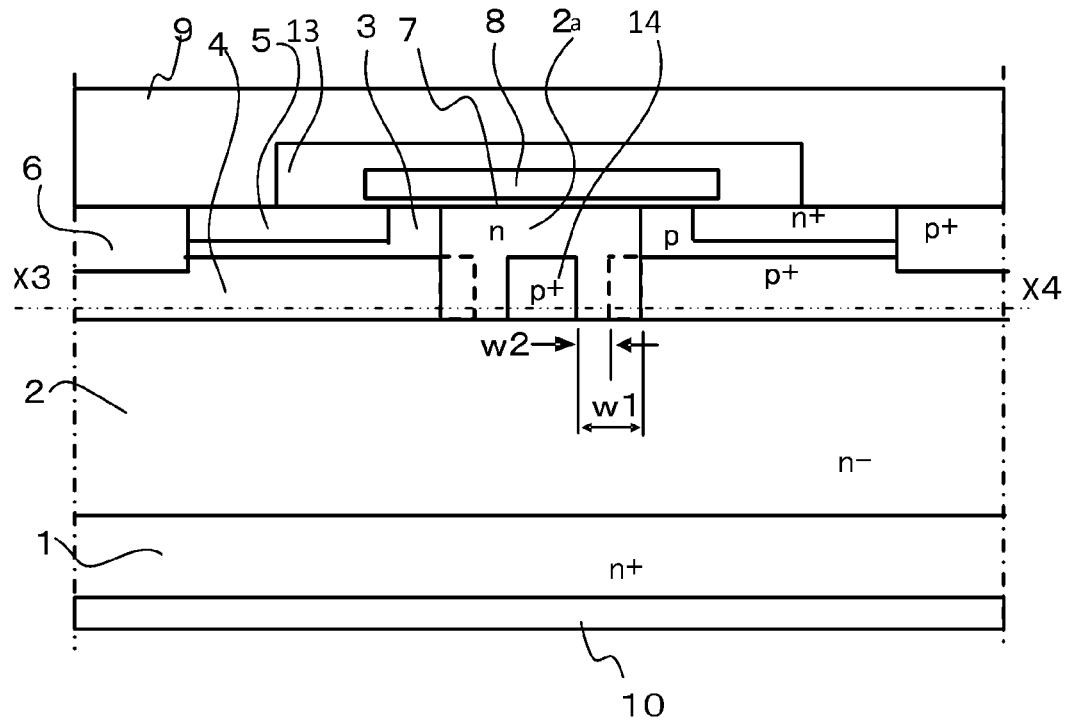
FIG. 2A is a cross-sectional view of the main parts of the planar gate SiC-MOSFET and FIG. 2B is a horizontal cross-sectional view of the main parts in FIG. 2A along the striped line X3-X4 according to a modification example of Embodiment 1 of the present invention.
Figure 2B:
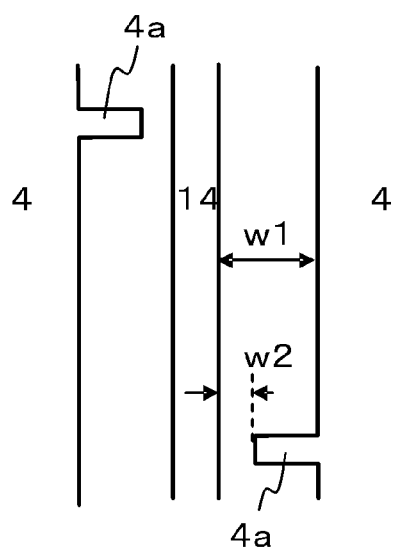

As shown in FIGS. 2A and 2B, instead of the protruding parts 14$a$, protruding parts 4$a$ may be provided on the respective side faces of the p$^+$ base region 4. The p$^+$ floating region 14 has a potential that is close to the p$^+$ base region 4 due to the depletion layer punching through at a low voltage to a gap (w2) portion that is narrower because of the protruding parts 14$a$ or protruding parts 4$a$, as compared to a gap (w1) where the depletion layer spreads from the p$^+$ base region 4 following an increase in applied voltage during the OFF state. Thus, when the reverse-bias voltage across the p-n junction increases as a result of an increase in the applied voltage during the OFF state, then a depletion layer will also spread from the floating p$^+$ region 14, and the portions where the protruding parts 14$a$ or the protruding parts 4$a$ are not formed can be pinched off with ease. This reduces the electric field applied to the gate insulating film and increases the breakdown voltage.

Meanwhile, the reverse-bias voltage across the p-n junction during the ON state is mainly the amount of voltage that has dropped due to the current flowing through the channel resistance and JFET resistance, and thus, the value thereof is small. Accordingly, the depletion layer that spreads from the p$^+$ base region 4 does not reach the floating p$^+$ region 14, and even if the depletion layer from the p$^+$ base region 4 reaches the floating p$^+$ region 14, the depletion layer from the floating p$^+$ region 14 would be insignificant; therefore, the JFET effect will be small. As a result, the trade-off between reducing the electric field applied to the gate insulating film and lowering on-resistance can be improved. In FIGS. 1A and 1B, the protruding parts 14$a$ are disposed on a portion of the floating p$^+$ region 14 (FIG. 1B) and in FIGS. 2A and 2B, the protruding parts 4$a$ are disposed on a portion of the p$^+$ base region 4 (FIG. 2B), but both of these protruding parts may be provided on the respective p$^+$ floating region and p$^+$ base region to provide a portion that reduces the gap between the floating p$^+$ region 14 and the p$^+$ base region 4.

Figure 3A:
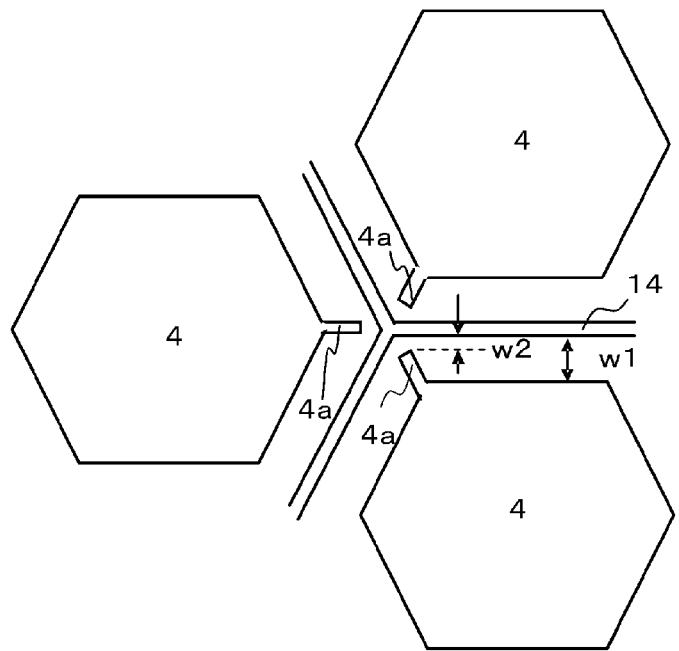
FIG. 3A is a horizontal cross-sectional view of main parts corresponding to FIG. 1B of the coplanar SiC-MOSFET when Embodiment 1 is applied to a cell that has a hexagon shape in a plan view.
Figure 3B:
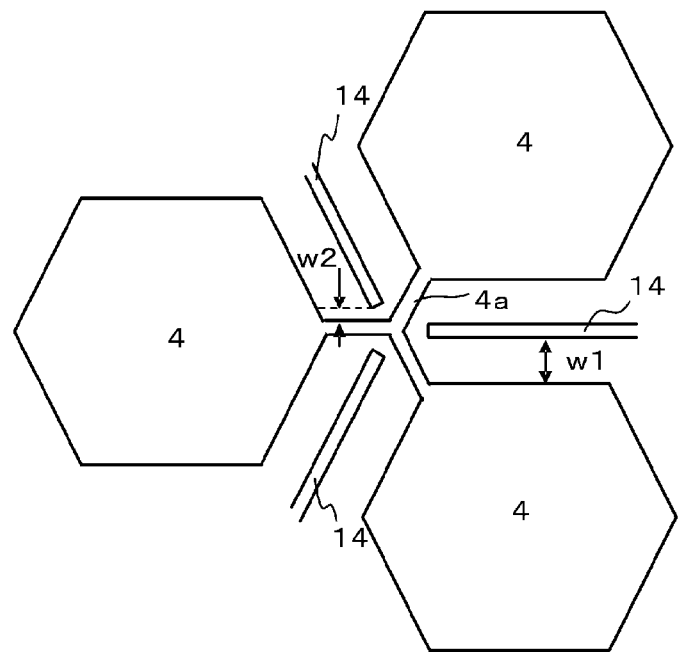
FIG. 3B is a horizontal cross-sectional view of a modification example thereof.

FIGS. 3A and 3B are horizontal cross-sectional views of a SiC-MOSFET corresponding to a cross section along the line X1-X2 of FIGS. 1A and 1B when the front surface cell pattern is hexagonal. In the hexagonal front surface cell pattern structures shown in FIG. 3A and FIG. 3B, similar effects to above of improving the trade-off relationship between reducing the electric field applied to the gate insulating film and lowering on-resistance can be achieved by providing a wide portion (w1) and a narrow portion (w2) between the respective floating p$^+$ regions 14 and the p$^+$ base regions 4. In the hexagonal front surface cells, there are problems such as the gap between the p$^+$ base regions 4 that are adjacent to each other near the respective tips of the hexagonal shapes becoming wider, the pinch-off effect being lowered at this location, the electric field applied to the gate insulating film becoming higher, and the breakdown voltage being reduced. Therefore, it is particularly effective to provide a portion where the gap between the respective floating p$^+$ regions 14 and the p$^+$ base regions 4 is narrow at the respective tips of the hexagonal cells. Furthermore, a similar advantageous structure can be adapted to square surface cells or rectangular surface cells in addition to the hexagonal surface cells described above. The respective floating p$^+$ regions 14 and the p$^+$ base regions 4 can be formed in the same mask step and ion implantation step.

Embodiment 2

Figure 4:
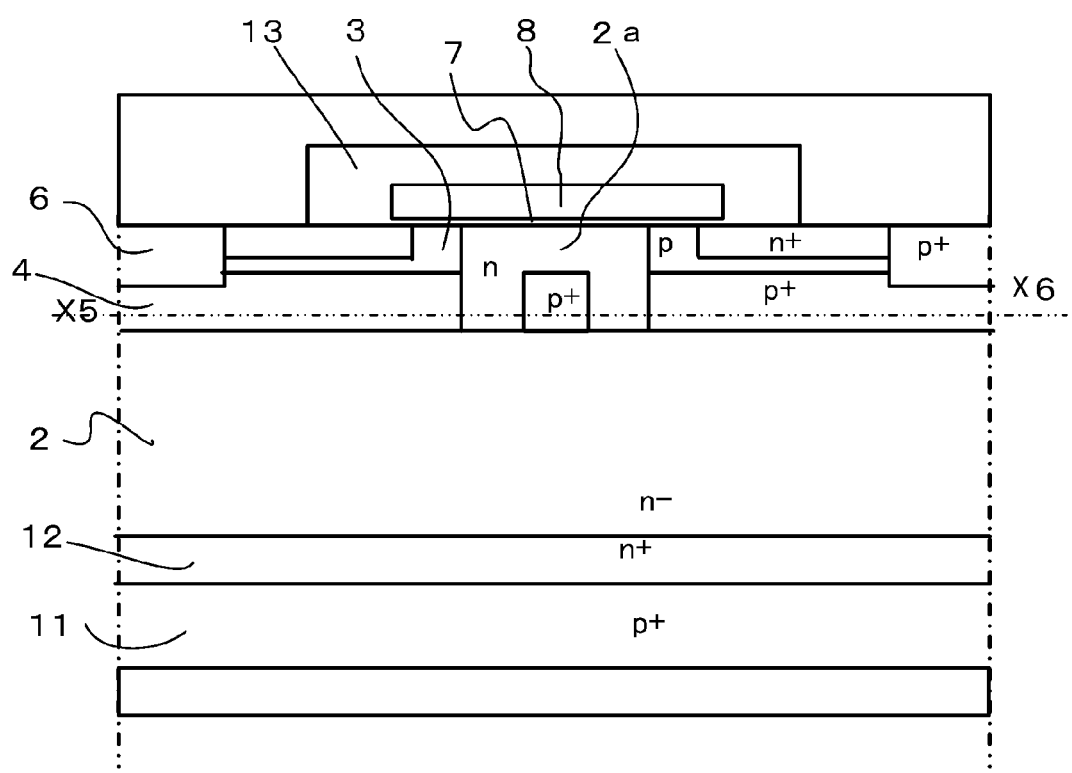
FIG. 4 is a cross-sectional view of main parts of a planar gate SiC-IGBT according to Embodiment 2 of the present invention.

FIG. 4 is a vertical cross-sectional view of a single cell of an SiC-IGBT (insulated gate bipolar transistor) semiconductor substrate according to Embodiment 2 of the present invention. FIG. 4 differs from FIGS. 1A and 1B in that a p-type semiconductor substrate (p$^+$ substrate 11) with a high impurity concentration is provided instead of the n$^+$ substrate 1, and an n-type buffer layer 12 (or a field stop layer) is disposed between an n$^-$ drift layer 2 and the p$^+$ substrate 11. Furthermore, in the IGBT, the terms emitter and collector are used instead of source/drain as used for the MOSFET above. As before, in a horizontal cross-sectional view along the line X5-X6 in FIG. 4, the striped surface cell pattern or the hexagonal surface cell pattern can each achieve effects similar to Embodiment 1.

MOSFETs are unipolar, and fundamentally have no conductivity modulation; thus, MOSFETs are commonly used for devices with low breakdown voltage. As a result, the channel resistance component (inversion layer resistance) is dominant for on-resistance of the device. In the planar gate MOSFET shown in FIGS. 1A and 1B, providing the floating p$^+$ region 14 increases cell pitch and thereby increases on-resistance.

Meanwhile, in the single cell of the IGBT shown in the vertical cross-sectional drawing in FIG. 4, which is normally applied to devices with a high breakdown voltage, during the ON state, the resistance component of the thick drift layer is dominant, and channel resistance is not dominant unlike the cases described above. Therefore, in the IGBT, the disadvantages caused by an increase in cell pitch by providing the floating p$^+$ region 14 are reduced, making it possible to achieve even greater effects. In FIG. 4, a structure of a punch-through IGBT (or a field stop IGBT) is shown in which the depletion layer stretches through the drift layer and reaches the n$^+$ layer with an applied voltage of design breakdown voltage, but it is also possible to use a non-punch through IGBT, i.e., an IGBT without the n-type buffer layer (or field stop layer) 12.

Embodiment 3

Figure 5:
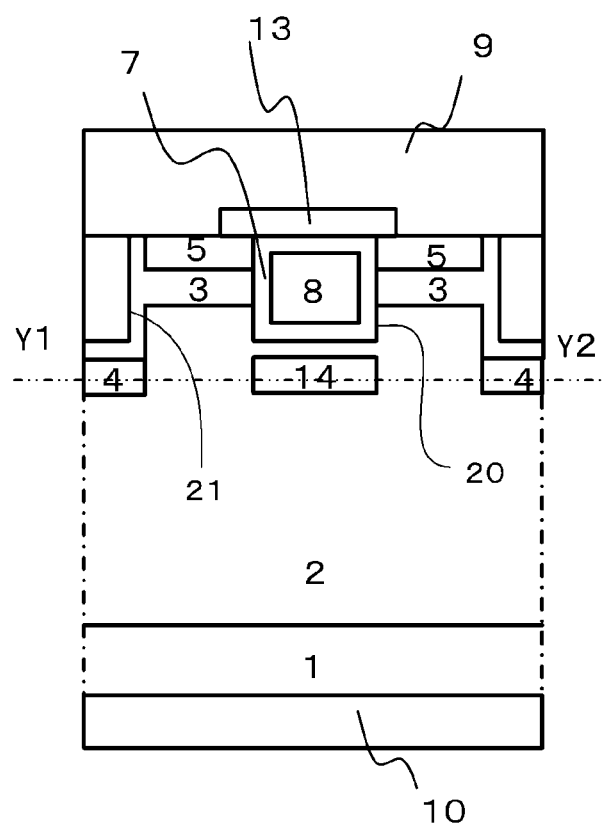
FIG. 5 is a cross-sectional view of main parts of a trench gate SiC-MOSFET according to Embodiment 3 of the present invention.

FIG. 5 is a vertical cross-sectional view of a single cell of a trench gate SiC-MOSFET according to Embodiment 3 of the present invention. In FIG. 5, a floating p$^+$ region 14 is formed below a first trench 20 with a gap therebetween, and the first trench 20 is where a gate electrode 8 is embedded across a gate insulating film 7. A p$^+$ region 4 is formed by an embedded epitaxial method, for example, directly below the bottom of a second trench 21, which is where a source electrode 9 is embedded. In FIG. 5, the floating p$^+$ region 14 is formed in an area directly below the gate insulating film 7 and is separated therefrom as described above to prevent potential adverse effects on a gate insulating film 7. But these may also be in contact with each other in appropriate cases. The plan view shape of the floating p$^+$ region 14 and the p$^+$ base region 4 in a horizontal cross-sectional along the line Y1-Y2 in FIG. 5 may be a striped cell pattern or a hexagonal surface cell pattern, and any of the plan view cell patterns in FIGS. 1B, 2B, 3A and 3B can be used. In such a trench gate MOSFET, there is the advantage that the floating p$^+$ region 14 directly below the first trench 20 of the trench gate structure does not increase the cell pitch. Furthermore, in Embodiment 3, effects similar to the MOSFET described before can be achieved even with an IGBT, by providing the p$^+$ layer (collector layer) on the rear surface side in a manner similar to FIG. 4. In the present embodiment, the source electrode 9 is embedded in the second trench 21, but alternatively, high concentration p-type poly-Si or high concentration p-type epitaxially grown film may be embedded in the second trench and be connected to the source electrode 9.

Embodiment 4

Figure 6:
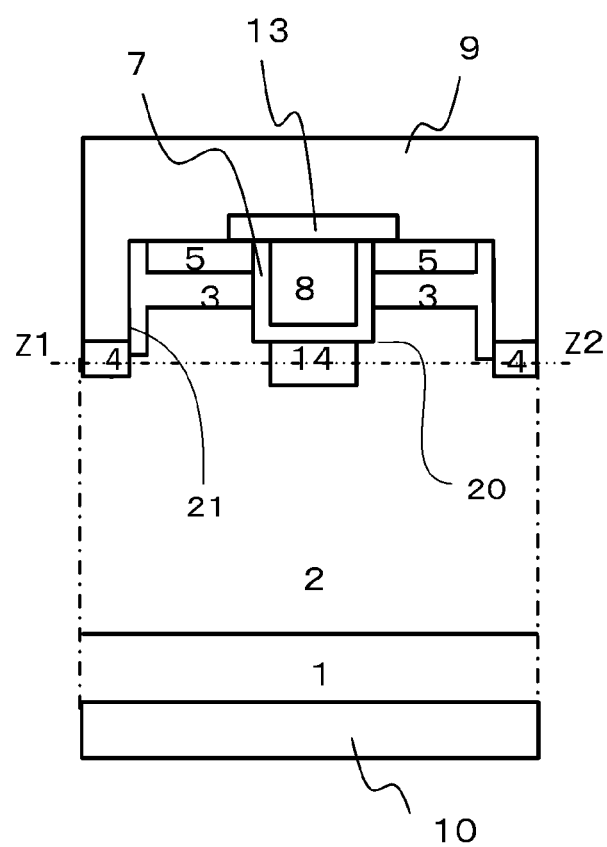
FIG. 6 is a cross-sectional view of main parts of a trench gate SiC-MOSFET according to Embodiment 4 of the present invention.
Figure 7:
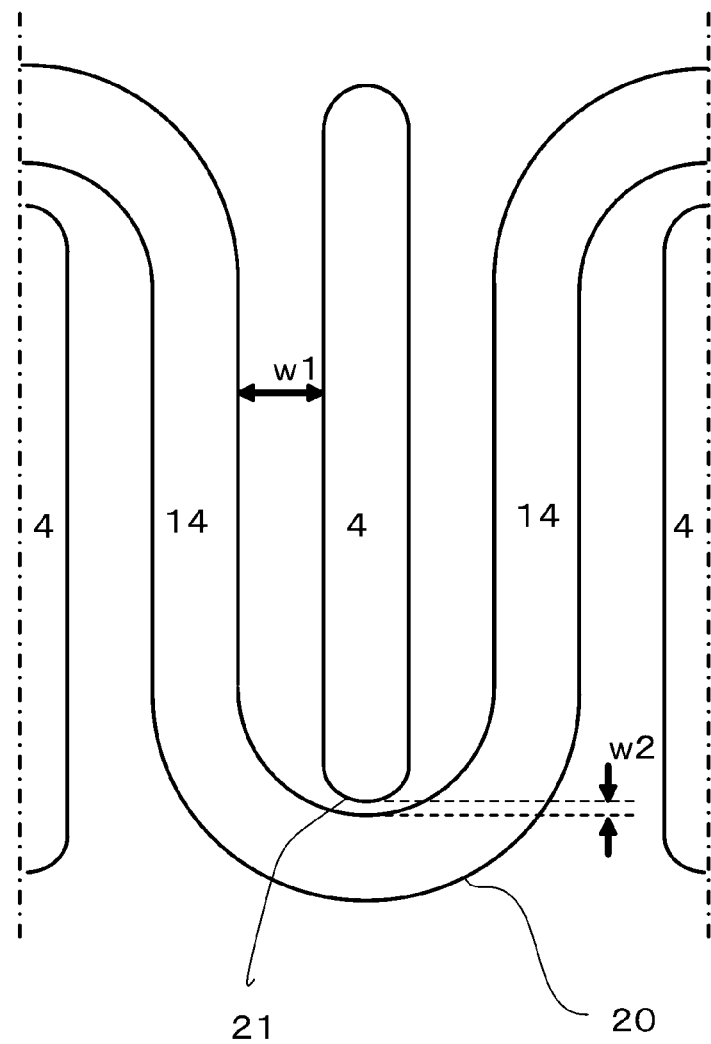
FIG. 7 is a horizontal cross-sectional view of main parts of the trench gate SiC-MOSFET of FIG. 6 along the line Z1-Z2 applied to a cell that has a stripe shape in a plan view according to Embodiment 4 of the present invention.

FIG. 6 is a vertical cross-sectional view of a single cell of a trench gate SiC-MOSFET according to Embodiment 4 of the present invention. FIG. 7 shows a horizontal cross-sectional view of FIG. 6 along the line Z1-Z2. In Embodiment 4, an example is shown in which a floating p$^+$ region 14 and a p$^+$ base region 4 are formed by ion implantation before a step (backfilling step) in which a poly-Si gate electrode and source electrode are embedded in respective first and second trenches 20 and 21 of a gate trench structure and a trench source structure. The configuration in Embodiment 4 can be used during the backfilling step of the trenches, when the efficiency of making the trench width uniform is high and when it is not preferable to form protruding parts for making the gaps narrower as shown in FIGS. 1A and 1B to 3.

In other words, as shown in FIG. 7, it is possible form a gap (w2) that is narrower than a gap (w1) between the floating p$^+$ region 14 and the p$^+$ base region 4 by moving the edge in a plan view pattern of the second trench 21 closer to the first trench 20, without forming the protruding parts as shown in FIGS. 1A to 3.

In FIG. 6, the floating p$^+$ region 14 is formed directly below the first trench 20 via a gate insulating film 7, but the floating p$^+$ region 14 may be formed separated from the gate insulating film 7 by increasing the acceleration voltage during ion implantation.

In Embodiment 4, similar effects to the MOSFET described before can be achieved even with an IGBT, by providing the p$^+$ layer (collector layer) on the rear surface side in a manner similar to FIG. 4. In Embodiment 4, the source electrode 9 is embedded in the second trench 21, but poly-Si may be embedded in the second trench 21 or a high concentration p-type epitaxially grown film may be embedded in the second trench 21 and connected to the source electrode 9.

According to Embodiments 1 to 4 and their modification examples of the present invention described above, if the depletion layer that spreads from the p$^+$ base region 4 in the OFF state reaches the floating p$^+$ region 14 and punches-through to the floating p$^+$ region 14, the depletion region will then also spread from the floating p$^+$ region 14 following another increase in voltage. Therefore, the JFET region can be pinched off with ease. As a result, the electric field applied to the gate insulating film can be reduced, thereby preventing a breakdown thereof, and a reduction in breakdown voltage can also be prevented.

In the ON state, the spread of the depletion layer from the p$^+$ base region 4 is small, the depletion layer does not punch-through to the floating p$^+$ region 14, and there is no spread of the depletion layer from the floating high impurity concentration p$^+$ region 14; therefore, it is possible to prevent an increase in on-resistance due to JFET effect. As a result, the trade-off between reducing the electric field applied to the gate insulating film and lowering on-resistance can be improved.

It will be apparent to those skilled in the art that various modification and variations can be made in the present invention without departing from the spirit or scope of the invention. Thus, it is intended that the present invention cover modifications and variations that come within the scope of the appended claims and their equivalents. In particular, it is explicitly contemplated that any part or whole of any two or more of the embodiments and their modifications described above can be combined and regarded within the scope of the present invention.

What is claimed is:

1. A wide bandgap insulated gate semiconductor device, comprising:
    a semiconductor substrate made of semiconductor having a bandgap wider than silicon;
    a first conductivity type drift layer over the semiconductor substrate, said drift layer having a low impurity concentration;
    a plurality of second conductivity type channel regions selectively disposed over the drift layer;
    first conductivity type semiconductor regions selectively disposed in respective surfaces in said channel regions, said first conductivity type semiconductor regions having a high impurity concentration;
    a plurality of second conductivity type base regions in contact with bottoms of the respective channel regions, said base regions having a high impurity concentration;
    a protruding drift layer portion that is a first conductivity type region interposed between said plurality of channel regions and said plurality of second conductivity type base regions thereunder;
    a gate electrode formed, through a gate insulating film, on the protruding drift layer portion and on respective surfaces of the channel regions;
    a first common electrode in contact with the first conductivity type semiconductor regions in said channel regions; and
    a second conductivity type floating region inside the protruding drift layer portion, having side faces respectively facing side faces of the second conductivity type base regions, the second conductivity type floating region having a high impurity concentration,
    wherein respective gaps between said second conductivity type base regions and said second conductivity type floating region defined by the respective side faces have a wide portion and a narrow portion.

2. The wide bandgap insulated gate semiconductor device according to claim 1, wherein a protruding part is provided in at least one of said side face of each of the second conductivity type floating regions and said side face of the corresponding second conductivity type base region so as to have the wide portion and the narrow portion in the gap.

3. The wide bandgap insulated gate semiconductor device according to claim 1,
    wherein the insulated gate semiconductor device is a metal-oxide-semiconductor field-effect transistor.

4. The wide bandgap insulated gate semiconductor device according claim 1,
    wherein the insulated gate semiconductor device is an insulated gate bipolar transistor.

5. The wide bandgap insulated gate semiconductor device according to claim 1,
    wherein the semiconductor substrate is made of silicon carbide semiconductor, gallium nitride semiconductor, or diamond.

* * * * *